US010514412B2

(12) United States Patent
Kang et al.

(10) Patent No.: US 10,514,412 B2
(45) Date of Patent: Dec. 24, 2019

(54) SYSTEMS AND METHODS FOR IDENTIFYING FAULTED SEGMENTS IN MULTIPHASE POWER NETWORKS

(71) Applicant: ABB Inc., Cary, NC (US)

(72) Inventors: Ning Kang, Morrisville, NC (US); Mirrasoul Mousavi, Cary, NC (US)

(73) Assignee: ABB Inc., Cary, NC (US)

( * ) Notice: Subject to any disclaimer, the term of this patent is extended or adjusted under 35 U.S.C. 154(b) by 497 days.

(21) Appl. No.: 15/174,687

(22) Filed: Jun. 6, 2016

(65) Prior Publication Data
US 2016/0282397 A1    Sep. 29, 2016

Related U.S. Application Data

(63) Continuation of application No. PCT/US2014/068970, filed on Dec. 7, 2014.
(Continued)

(51) Int. Cl.
*G01R 31/02*    (2006.01)
*G01R 31/08*    (2006.01)
(Continued)

(52) U.S. Cl.
CPC .......... *G01R 31/024* (2013.01); *G01R 31/08* (2013.01); *G01R 31/086* (2013.01); *H02H 3/405* (2013.01); *H02H 7/28* (2013.01); *Y04S 10/522* (2013.01)

(58) Field of Classification Search
None
See application file for complete search history.

(56) References Cited

U.S. PATENT DOCUMENTS

| 5,825,189 A * | 10/1998 | Johns | G01R 31/085 |
| | | | 324/525 |
| 2002/0053912 A1 * | 5/2002 | Saha | G01R 31/088 |
| | | | 324/525 |

(Continued)

FOREIGN PATENT DOCUMENTS

| CN | 101625389 A | 1/2010 |
| CN | 102255290 A | 11/2011 |
| EP | 1172660 A2 | 1/2006 |

OTHER PUBLICATIONS

Patent Cooperation Treaty International Search Report cited in priority Patent Application No. PCT/US2014/068970 dated Mar. 18, 2015 (3 pages).

(Continued)

*Primary Examiner* — Jermele M Hollington
*Assistant Examiner* — Suresh K Rajaputra
(74) *Attorney, Agent, or Firm* — Taft Stettinius & Hollister LLP; J. Bruce Schelkopf

(57) ABSTRACT

Systems and methods for identifying faulted segment(s) in a multiphase power network may include receiving a current measurement that was measured during a fault, obtaining a set of equivalent sequence impedances for the segments, building a set of sequence bus impedance matrices, selecting a segment, calculating coefficients for the segment based on the set of equivalent sequence impedances for the segment and the sequence bus impedance matrices, calculating an estimated per unit fault distance for the segment based at least partially on the current measurement and the coefficients, identifying the segment as a potentially faulted segment if the estimated fault distance for the segment is between about zero and about one, and repeating for each of the segments the calculating coefficients, calculating an estimated per unit fault distance, and identifying as a poten- (Continued)

tially faulted segment if the estimated fault distance for the segment is between about zero and about one.

22 Claims, 9 Drawing Sheets

Related U.S. Application Data

(60) Provisional application No. 61/913,218, filed on Dec. 6, 2013.

(51) Int. Cl.
  *H02H 3/40* (2006.01)
  *H02H 7/28* (2006.01)

(56) References Cited

U.S. PATENT DOCUMENTS

| | | |
|---|---|---|
| 2005/0114048 A1 | 5/2005 | Choi et al. |
| 2011/0031977 A1 | 2/2011 | O'Sullivan et al. |
| 2013/0346011 A1* | 12/2013 | Ou .......................... H02J 3/06 |
| | | 702/123 |
| 2014/0052391 A1* | 2/2014 | Feng .................... G01R 31/086 |
| | | 702/58 |

OTHER PUBLICATIONS

Patent Cooperation Treaty Written Opinion of the International Searching Authority cited in priority Patent Application No. PCT/US2014/068970 dated Mar. 18, 2015 (4 pages).

* cited by examiner

SYSTEMS AND METHODS FOR IDENTIFYING FAULTED SEGMENTS IN MULTIPHASE POWER NETWORKS

CROSS REFERENCE TO RELATED APPLICATION(S)

This application claims the benefit of and priority to U.S. Provisional Patent Application Ser. No. 61/913,218, which was filed on Dec. 6, 2013 and is entitled "SYSTEMS AND METHODS FOR FAULTED SEGMENT IDENTIFICATION IN MULTIPHASE POWER SYSTEMS." The complete disclosure of the above-identified patent application is hereby incorporated by reference for all purposes.

STATEMENT REGARDING FEDERALLY SPONSORED RESEARCH OR DEVELOPMENT

This invention was made with U.S. Government support under Contract No. DE-OE0000547 awarded by the Department of Energy. The Government has certain rights in this invention.

FIELD OF THE DISCLOSURE

The present disclosure relates to electrical power networks, and more particularly to identifying faulted segments in multiphase power networks.

BACKGROUND

Three-phase electrical power circuits, such as those with unbalanced circuits and/or those composed of many single-phase and double-phase laterals, such as those often found in the ANSI type networks, may present difficulties for some fault location methods for three-phase circuits, such as those based on sequence domain modeling. In particular, the multiphase topology and composition of such circuits may limit the application of conventional fault location methods to three-phase main lines, even though many faults (over 80%, in some examples) may occur on single-phase or double-phase laterals.

SUMMARY

In some examples, methods for identifying a faulted segment in a multiphase power network that includes a plurality of segments may include receiving at least one current measurement measured during a fault by an intelligent electronic device (IED) disposed within the power network, obtaining a set of equivalent sequence impedances for each of the plurality of segments, and building a set of sequence bus impedance matrices for a set of sequence networks defined for the multiphase power network. The methods may further include selecting a segment from the plurality of segments, calculating coefficients for the segment based on the set of equivalent sequence impedances for the segment and the sequence bus impedance matrices, calculating an estimated per unit fault distance for the segment based at least partially on the at least one current measurement and the coefficients for the segment, identifying the segment as a potentially faulted segment if the estimated per unit fault distance for the segment is within a range from about zero through about one, and repeating for each of the plurality of segments the elements of selecting a segment, calculating coefficients, calculating an estimated per unit fault distance, and identifying as a potentially faulted segment if the estimated per unit fault distance for the segment is within a range from about zero through about one.

In some examples, non-transitory computer readable storage media may have embodied thereon a plurality of machine-readable instructions that when executed by at least one computer processor cause the at least one computer processor to perform a method for identifying a faulted segment in a multiphase power network that includes a plurality of segments. The plurality of machine-readable instructions may include instructions to receive at least one current measurement measured during a fault by an intelligent electronic device (IED) disposed within the power network, instructions to obtain a set of equivalent sequence impedances for each of the plurality of segments, and instructions to build a set of sequence bus impedance matrices for a set of sequence networks defined for the multiphase power network. The instructions may further include instructions to select a segment from the plurality of segments, instructions to calculate coefficients for the segment based on the set of equivalent sequence impedances for the segment and the sequence bus impedance matrices, instructions to calculate an estimated per unit fault distance for the segment based at least partially on the at least one current measurement and the coefficients for the segment, instructions to identify the segment as a potentially faulted segment if the estimated per unit fault distance for the segment is within a range from about zero through about one, and instructions to repeat for each of the plurality of segments the instructions to select a segment, calculate coefficients, calculate an estimated per unit fault distance, and identify as a potentially faulted segment if the estimated per unit fault distance for the segment is within a range from about zero through about one.

In some examples, systems for identifying a faulted segment in a multiphase power network that includes a plurality of segments may include at least one intelligent electronic device (IED) disposed within the power network and a computing device comprising a plurality of machine-readable instructions embodied on a computer readable storage medium and a processor configured to execute the instructions. The plurality of machine-readable instructions may include instructions to receive at least one current measurement measured during a fault by an intelligent electronic device (IED) disposed within the power network, instructions to obtain a set of equivalent sequence impedances for each of the plurality of segments, and instructions to build a set of sequence bus impedance matrices for a set of sequence networks defined for the multiphase power network. The instructions may further include instructions to select a segment from the plurality of segments, instructions to calculate coefficients for the segment based on the set of equivalent sequence impedances for the segment and the sequence bus impedance matrices, instructions to calculate an estimated per unit fault distance for the segment based at least partially on the at least one current measurement and the coefficients for the segment, instructions to identify the segment as a potentially faulted segment if the estimated per unit fault distance for the segment is within a range from about zero through about one, and instructions to repeat for each of the plurality of segments the instructions to select a segment, calculate coefficients, calculate an estimated per unit fault distance, and identify as a potentially faulted segment if the estimated per unit fault distance for the segment is within a range from about zero through about one.

DETAILED DESCRIPTION

As will be more fully explained below, the disclosed systems and methods provide a methodology that may be used to identify faulted segment(s) in a multiphase power circuit or network, such as one composed of tens or even hundreds of feeder segments, by using sequence component modeling and bus impedance matrix formulation. In some examples, a segment of a multiphase power circuit or network may refer to a portion of a power line between two switches. As may be understood, identifying faulted segment(s) in a timely manner may support speeding up the power restoration process, which may contribute to greater power network or system reliability and/or customer satisfaction.

As will be more fully explained below, the disclosed systems and methods may utilize readily available line impedance parameters in the sequence domain (zero and positive sequence values), which can be more readily calculated from standard tables given the conductor size and material, which may eliminate the need for phase parameters in ABC domain (which may not be directly available or may be difficult to obtain). Using line impedance parameters in the sequence domain may simplify the line modeling requirements, which may allow for reduced implementation costs. As may be understood, the systems and methods disclosed herein may be used to address the multiple faulted segment estimation problem that may be found in some fault location methods.

As will be more fully explained below, the disclosed systems and methods may utilize fundamental frequency root mean square (RMS) current measurements in conjunction with an approximate sequence model of the multiphase feeder. In some examples, the utilized model may include single-phase and double-phase line segments augmented with dummy lines. This method may sweep all the line segments and directly calculate a fault location estimate for each segment. If the produced fault location estimate is between about zero (0) and about one (1) per unit (p.u.), or even between zero (0) and one (1) per unit, the corresponding segment may be regarded as a faulted segment candidate.

The following paragraphs describe nonexclusive illustrative examples of methods, which may be computer implemented, such as where a computer processor performs some or all of the method, for identifying faulted segments in a multiphase power network that includes a plurality of segments. The actions of the disclosed methods may be performed in the order in which they are presented herein. However, unless the context or the actions of the method indicate otherwise, it is within the scope of this disclosure for the actions, either alone or in various combinations, to be performed before and/or after any of the other actions. It is further within the scope of this disclosure for the disclosed methods to omit one or more of the disclosed actions and/or to include one or more actions in addition to those disclosed herein.

Figure 1:
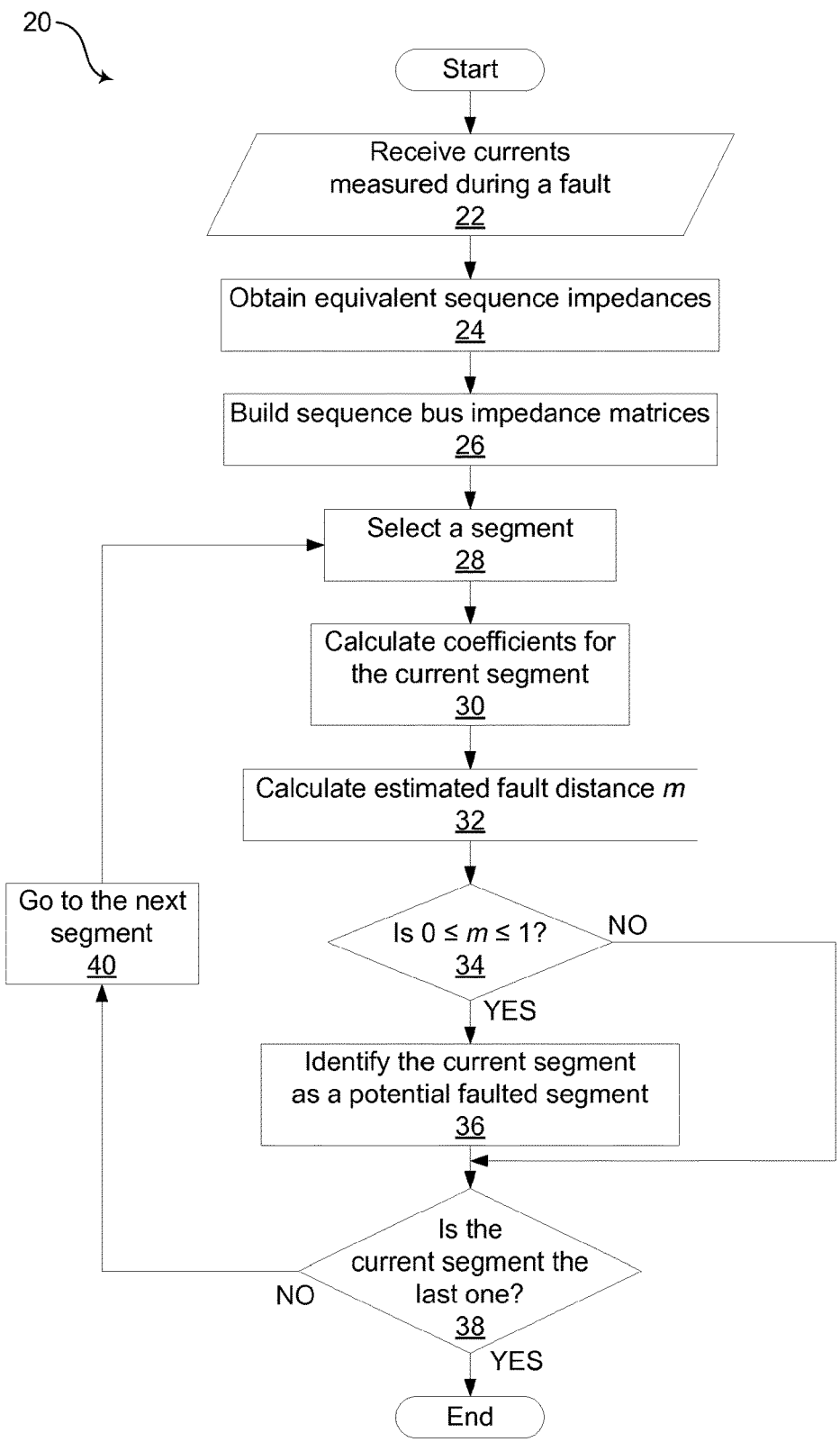
FIG. 1 is a flowchart of a nonexclusive illustrative example of a method for identifying a faulted segment in a multiphase power network.

A nonexclusive illustrative example of a method for identifying a faulted segment in a multiphase power network that includes a plurality of segments is illustrated by way of the flowchart 20 in FIG. 1. Unless otherwise specified, the method illustrated in FIG. 1 may include or be used with any of the actions and/or structures disclosed herein.

As shown in the illustrated example, the method illustrated in FIG. 1 may begin with receiving at least one current measurement that was or is measured during a fault, as indicated in block 22. The current measurements may be read or received from any suitable source, such as from an intelligent electronic device (IED) that is suitably disposed or located within the power network. In some examples, the at least one current measurement may be a measurement of a single-phase current, a two-phase current and/or a three-phase current.

The method illustrated in FIG. 1 includes obtaining a set of equivalent sequence impedances for each of the plurality of segments (block 24), and building a set of sequence bus impedance matrices for a set of sequence networks defined for the multiphase power network (block 26). As indicated at block 28, a segment is selected from the plurality of segments. Then, coefficients are calculated for the selected segment based on the set of equivalent sequence impedances for the segment and the sequence bus impedance matrices, as generally indicated at block 30. An estimated per unit fault distance m is calculated for the segment based at least partially on the at least one current measurement and the coefficients for the segment, as indicated at block 32. If the estimated per unit fault distance m for the segment is within a range from about zero (0) through about one (1), the segment may be identified as a potentially faulted segment, as indicated at blocks 34 and 36.

If the currently selected segment is not the last one of the plurality of segments (block 38), the method illustrated in FIG. 1 proceeds to the next segment (block 40) and repeats for each of the plurality of segments the elements of selecting a segment (block 28), calculating coefficients (block 30), calculating an estimated per unit fault distance (block 32), and identifying as a potentially faulted segment if the estimated per unit fault distance for the segment is within a range from about zero through about one (blocks 34 and 63).

As may be understood, the method illustrated in FIG. 1 may select a first and/or next segment (at block 28) in any suitable manner, such as starting at a feeder head, proximate a distributed generation resource, or at any suitable location, and may sweep through the segments in any suitable order, including sequentially from a suitable starting point, such as at a feeder head or proximate a distributed generation resource.

Various aspects of methods for identifying a faulted segment in a multiphase power network that includes a plurality of segments are discussed below in more detail with reference to the method illustrated in FIG. 1.

As indicated at block 24 of FIG. 1, a set of equivalent sequence impedances is obtained for each of the plurality of segments. In some examples, the set of equivalent sequence impedances for each of the plurality of segments may include three equivalent sequence impedances; namely, an equivalent zero-sequence impedance for the segment, an equivalent positive-sequence impedance for the segment, and an equivalent negative-sequence impedance for the segment. The set of equivalent sequence impedances may be based on equivalent three-phase line models for multiphase (single-phase, two-phase and/or three-phase) line segments using dummy lines. In some examples, the shunt capacitances of the lines and loads may be ignored in this approximate model. Given the conductor size and material of a particular line segment, one can obtain the zero-sequence impedance $z'_0$ and positive-sequence impedance $z'_1$ of the line segment, such as from a standard impedance table.

As generally indicated at block 26 of FIG. 1, a set of sequence bus impedance matrices may be built for a set of sequence networks defined for the multiphase power network. As is known, for a three-phase conductor, the zero-sequence and positive-sequence impedances are readily the sequence parameters required for a set of sequence networks for the multiphase power network. In some examples, the set of sequence networks for a multiphase power network may include three sequence networks; namely, a zero-sequence network, a positive-sequence network and a negative-sequence network. For a two-phase conductor, the self-impedance, $z_s$, and mutual-impedance, $z_m$, are calculated from the sequence impedances as follows:

$$z_s = \frac{z'_0 + 2z'_1}{3} \quad (1)$$

$$z_m = \frac{z'_0 - z'_1}{3} \quad (2)$$

Figure 2:
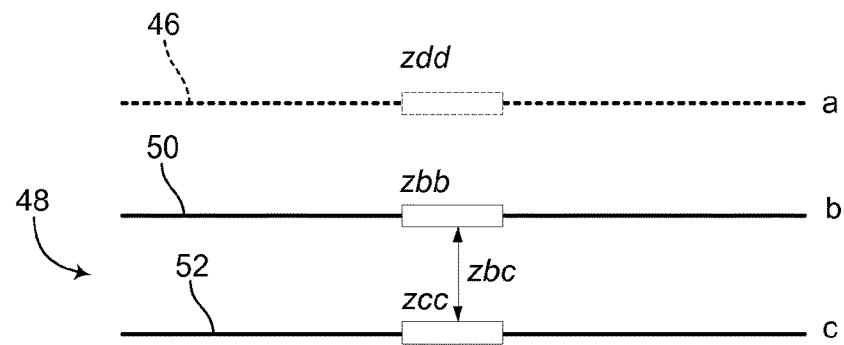
FIG. 2 is a nonexclusive illustrative example of a two-phase line segment with a "dotted" dummy line.

For a two-phase line with phase B and phase C conductors, the self impedance of phase B, $z_{bb}$, is equal to, $z_s$, and the self impedance of phase C, $z_{cc}$, is equal to $z_s$ as well. The mutual impedance between phase B and phase C, $z_{bc}$, equals $z_m$. A dummy line 46 with the self-impedance of $z_{dd}$ and zero mutual impedance may be added to the original two-phase line 48, as shown in FIG. 2. Since there is no mutual coupling between the dummy line 46 and the other two existing lines 50, 52, the current through this line is zero and so is the voltage across the line. As such, any value for $z_{dd}$ would satisfy the Ohm's law for the dummy line 46.

The series impedance matrix for the B-C line with a dummy line is written as follows:

$$Z_{series\_BC} = \begin{bmatrix} z_{dd} & 0 & 0 \\ 0 & z_{bb} & z_{bc} \\ 0 & z_{bc} & z_{cc} \end{bmatrix} \quad (3)$$

Average the two existing elements $z_{bb}$ and $z_{cc}$, and assign the value to all the diagonal elements in Equation (3), including $z_{dd}$, and ignore the mutual coupling between the two existing phases. The series impedance matrix now has the following form:

$$Z_{series\_BC} = \begin{bmatrix} \frac{z_{bb}+z_{cc}}{2} & 0 & 0 \\ 0 & \frac{z_{bb}+z_{cc}}{2} & 0 \\ 0 & 0 & \frac{z_{bb}+z_{cc}}{2} \end{bmatrix} \quad (4)$$

Applying the symmetrical component transformation to Equation (4) yields the equivalent sequence parameters for a two-phase conductor as follows:

$$z_0 = z_1 = \frac{z_{bb}+z_{cc}}{2} \quad (5)$$

Figure 3:
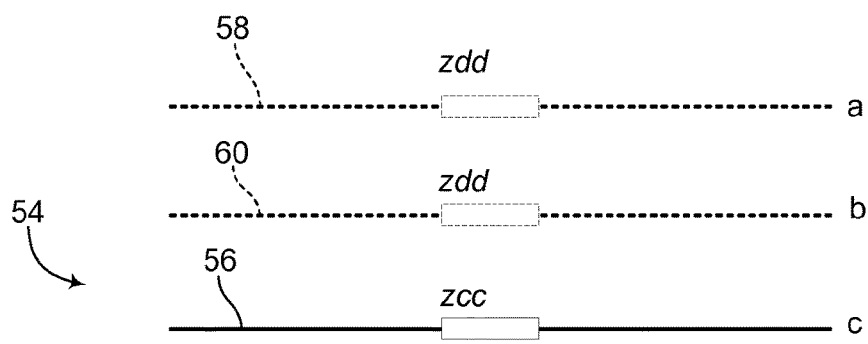
FIG. 3 is a nonexclusive illustrative example of a single-phase line segment with two "dotted" dummy lines.

For a single-phase line 54 with phase C conductor 56, as shown in FIG. 3, the self impedance of phase C, $z_{cc}$, is equal to $z_s$ calculated from Equation (1). Two dummy lines 58, 60 with the self-impedance of $z_{dd}$ and zero mutual impedance are added to the original single-phase line 54, as shown in FIG. 3. The series impedance matrix for the C-phase line with two dummy lines is written as follows:

$$Z_{series\_C} = \begin{bmatrix} z_{dd} & 0 & 0 \\ 0 & z_{dd} & 0 \\ 0 & 0 & z_{cc} \end{bmatrix} \quad (6)$$

where $z_{dd}$ can be any arbitrary number. Optionally, its value is taken as the one for the existing phase $z_{cc}$. The series impedance matrix now has the following form:

$$Z_{series\_C} = \begin{bmatrix} z_{cc} & 0 & 0 \\ 0 & z_{cc} & 0 \\ 0 & 0 & z_{cc} \end{bmatrix} \quad (7)$$

Applying the symmetrical component transformation to Equation (7) leads to the equivalent sequence impedance values:

$$z_0 = z_1 = z_{cc} \quad (8)$$

The sequence values for the other single-phase and two-phase lines with different phasing may be similarly derived.

Having obtained the equivalent sequence impedances for all line segments (three-phase, double-phase, or single-phase), a set of bus impedance matrices may be built for each of the set of sequence networks. As used herein, the bus impedance matrix for a sequence network may also be referred to as the sequence bus impedance matrix. In examples where the set of sequence networks includes three sequence networks; namely, a zero-sequence network, a positive-sequence network and a negative-sequence network, the set of sequence bus impedance matrices may include three sequence bus impedance matrices; namely, a zero-sequence bus impedance matrix, a positive-sequence bus impedance matrix and a negative-sequence bus impedance matrix, As may be understood, the method may then apply a transmission line-type of fault location method, which is based on symmetrical components, to identify a faulted segment in a multiphase electrical power distribution network or system that includes a plurality of segments.

Figure 4:
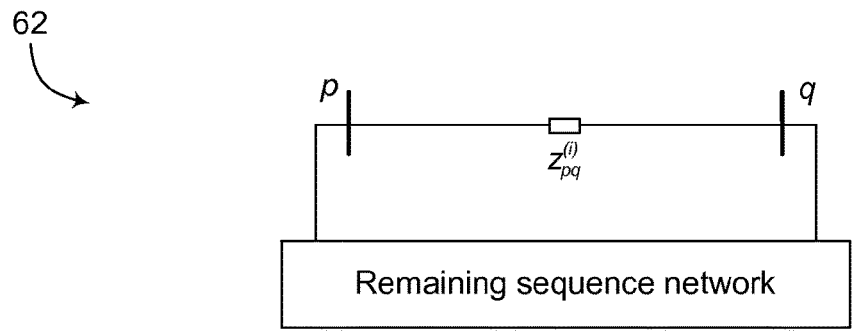
FIG. 4 is a nonexclusive illustrative example of a sequence network of a pre-fault network.
Figure 5:
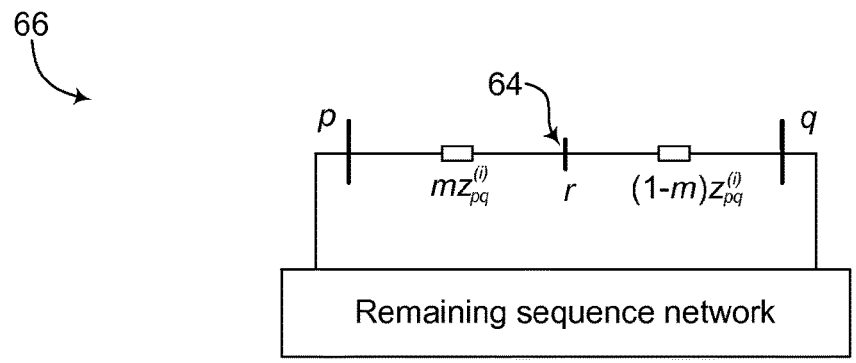
FIG. 5 is a nonexclusive illustrative example of the sequence network of FIG. 4 with an added virtual or imaginary fault node

The fault location method is briefly illustrated here with reference to FIGS. 4 and 5. For purposes of illustration, the faulted segment may be assumed to be known and has two terminal buses, p and q. A nonexclusive illustrative example of the pre-fault sequence network is shown in FIG. 4 at 62. A nonexclusive illustrative example of the sequence network with an added or additional virtual or imaginary fault node, or fictitious fault bus, at the fault point 64 is shown in FIG. 5 at 66. Here m is the per unit fault distance from bus p; n is the total number of buses of the pre-fault network; r is the virtual or imaginary fault node that represents the fault point 64, with r=n+1; i=0, 1, 2, denoting zero-, positive-, and negative-sequence quantities, respectively; $z_{pq}^{(i)}$ indicates the $i^{th}$ sequence impedance of the branch between bus p and q.

The sequence bus impedance matrices may be built based on the obtained equivalent sequence impedances for the line segments. The bus impedance matrix of the pre-fault $i^{th}$ sequence network, which may also be referred to as the $i^{th}$ pre-fault sequence bus impedance matrix, $Z_0^{(i)}$, has the size of n by n and is built from network parameters described with equivalent sequence values. $Z_{0,kl}^{(i)}$ signifies the element of $Z_0^{(i)}$ on the $k^{th}$ row and $l^{th}$ column. $Z^{(i)}$ denotes the bus impedance matrix of the $i^{th}$ sequence network with the addition of the virtual or imaginary fault node r, which has a size of (n+1) by (n+1) and may also be referred to as the $i^{th}$ sequence bus impedance matrix. $Z_{kl}^{(i)}$ signifies the element of $Z^{(i)}$ on the $k^{th}$ row and $l^{th}$ column. The first n by n elements of $Z^{(i)}$ are the same as in $Z_0^{(i)}$. The $i^{th}$ sequence bus impedance matrix, $Z^{(i)}$, has the following form:

$$Z^{(i)} = \begin{bmatrix} Z_{11}^{(i)} & \cdots & Z_{1l}^{(i)} & \cdots & Z_{1n}^{(i)} & Z_{1r}^{(i)} \\ \vdots & \ddots & \vdots & \ddots & \vdots & \vdots \\ Z_{k1}^{(i)} & \cdots & Z_{kl}^{(i)} & \cdots & Z_{kn}^{(i)} & Z_{kr}^{(i)} \\ \vdots & \ddots & \vdots & \ddots & \vdots & \vdots \\ Z_{n1}^{(i)} & \cdots & Z_{nl}^{(i)} & \cdots & Z_{nn}^{(i)} & Z_{nr}^{(i)} \\ Z_{r1}^{(i)} & \cdots & Z_{rl}^{(i)} & \cdots & Z_{rn}^{(i)} & Z_{rr}^{(i)} \end{bmatrix} \quad (9)$$

where $$Z_{kl}^{(i)} = Z_{0,kl}^{(i)}, k, l = 1, 2 \ldots n \quad (10)$$

$$Z_{kr}^{(i)} = Z_{rk}^{(i)} = B_k^{(i)} + C_k^{(i)} m, k = 1, 2 \ldots n \quad (11)$$

$$Z_{rr}^{(i)} = A_0^{(i)} + A_1^{(i)} m + A_2^{(i)} m^2 \quad (12)$$

and, $$B_k^{(i)} = Z_{0,pk}^{(i)} \quad (13)$$

$$C_k^{(i)} = Z_{0,qk}^{(i)} - Z_{0,pk}^{(i)} \quad (14)$$

$$A_0^{(i)} = Z_{0,pp}^{(i)} \quad (15)$$

$$A_1^{(i)} = 2Z_{0,pq}^{(i)} - 2Z_{0,pp}^{(i)} + z_{pq}^{(i)} \quad (16)$$

$$A_2^{(i)} = Z_{0,pp}^{(i)} + Z_{0,qq}^{(i)} - 2Z_{0,pq}^{(i)} - z_{pq}^{(i)} \quad (17)$$

Equation (11) demonstrates that the transfer impedance between the virtual or imaginary fault node r and any other bus k (k=1, 2 . . . n) is a linear function of the unknown fault location or per unit fault distance m. As seen from Equation (12), the driving point impedance of the faulted bus is a quadratic function of the fault location or per unit fault distance m. The coefficients $B_k^{(i)}$, $C_k^{(i)}$, $A_0^{(i)}$, $A_1^{(i)}$ and $A_2^{(i)}$ are constants determined by the network parameters and the terminals of the faulted segment, which may be calculated for the segment based on the set of equivalent sequence impedances for the segment and the sequence bus impedance matrices, as indicated at block 30 in FIG. 1.

Next, an estimate of the per unit fault distance m for a segment may be calculated based at least partially on the at least one current measurement and the coefficients for a segment, as generally indicated by block 32 in FIG. 1. The definition of bus impedance matrix and VCR (voltage current relationships) may be used to formulate the positive-, negative-, and zero-sequence currents during the fault through any branch between bus k and l, $I_{kl}^{(1)}$, $I_{kl}^{(2)}$ and $I_{kl}^{(0)}$ into the following general form:

$$I_{kl}^{(1)} = I_{kl}^{(1)0} - \beta_{kl}^{(1)} I_f^{(1)} \quad (18)$$

$$I_{kl}^{(2)} = -\beta_{kl}^{(2)} I_f^{(2)} \quad (19)$$

$$I_{kl}^{(0)} = -\beta_{kl}^{(1)} I_f^{(1)} \quad (20)$$

Here $I_f^{(0)}$, $I_f^{(1)}$, $I_f^{(2)}$ denote the zero-, positive- and negative-sequence current flowing out of the fault point respectively. $I_{kl}^{(1)0}$ represents the pre-fault positive-sequence current through any branch kl (between bus k and l), and $$\beta_{kl}^{(i)} = B_{kl}^{(i)} + C_{kl}^{(i)} m, i = 0, 1, 2 \quad (21)$$

The calculation of $\beta_{kl}^{(i)}$ falls into two categories, depending on whether or not the branch kl is faulted or is coincident with pq:

a) when the branch kl is non-faulted or does not coincide with pq:

$$B_{kl}^{(i)} = \frac{B_k^{(i)} - B_l^{(i)}}{z_{kl}^{(i)}}; C_{kl}^{(i)} = \frac{C_k^{(i)} - C_l^{(i)}}{z_{kl}^{(i)}} \quad (22)$$

or, b) when the branch kl is faulted or is coincident with pq:

$$B_{kl}^{(i)} = \frac{C_k^{(i)} - A_1^{(i)}}{z_{kl}^{(i)}}; C_{kl}^{(i)} = \frac{-A_2^{(i)}}{z_{kl}^{(i)}} \quad (23)$$

where $z_{kl}^{(i)}$ represents the $i^{th}$ sequence impedance of any branch kl; $B_k^{(i)}$, $B_l^{(i)}$, $C_k^{(i)}$, $C_l^{(i)}$, $A_1^{(i)}$ and $A_2^{(i)}$ are obtained from Equations (13)-(14) and (16)-(17).

As may be seen from Equations (18)-(20), the superimposed sequence current through any branch is the function of sequence fault current, network parameters, the terminals of the faulted segment and the unknown fault location.

Next, based on the estimate of the per unit fault distance m, a determination may be made as to whether or not a segment is a potentially faulted segment. In particular, as indicated at blocks 34 and 36 in FIG. 1, if the per unit fault distance m, is ≥0 and ≤1 (i.e., between about zero (0) and about one (1) per unit), the current segment may be identified as a potential faulted segment.

Figure 6:
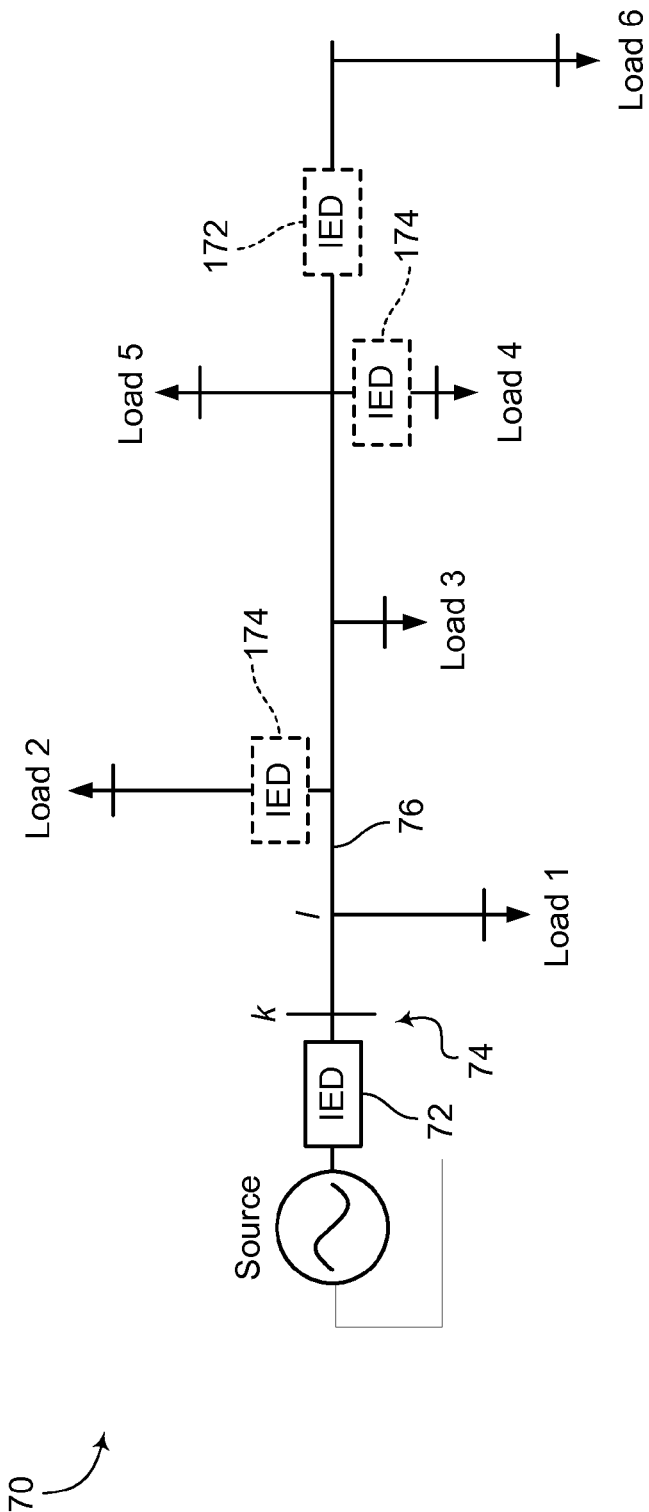
FIG. 6 is a nonexclusive illustrative example of a radial network with a single generation resource and an intelligent electronic device (IED) at the feeder head.

In some examples, a multiphase power network may be configured as a radial network, such as the nonexclusive illustrative example shown in FIG. 6 and generally indicated at 70. In some radial networks, the available current measurements may be measured by an IED 72 proximate the feeder head 74 of the feeder 76.

With regard to particular algorithms for different types of faults in radial networks, transforming the sequence quantities from Equations (18)-(20) into phase quantities, shows the fault location algorithms for different types of faults utilizing three-phase RMS current magnitude measurements during the fault from any branch kl, $|I_{kla}|$, $|I_{klb}|$ and $|I_{klc}|$.

For phase A to ground faults, the following formula may be used:

$$|I_{kla}| = \left| \frac{(B_{kl}^{(0)} + 2B_{kl}^{(1)}) + (C_{kl}^{(0)} + 2C_{kl}^{(1)})m}{(A_0^{(0)} + 2A_0^{(1)}) + (A_1^{(0)} + 2A_1^{(1)})m + (A_2^{(0)} + 2A_2^{(1)})m^2 + 3R_f} \right| \quad (24)$$

Assuming a certain value for the fault resistance $R_f$, the fault location or per unit fault distance m is the only unknown variable in Equation (24). Starting with an initial value of the per unit fault distance m, the method may utilize the Newton-Raphson technique to iteratively reach a solution for the per unit fault distance m.

For phase B to C to ground faults, the following formulations may be used:

$$|I_{klb}| = \left| \frac{(B_{kl}^{(0)} + C_{kl}^{(0)}m)Z_{rr}^{(2)}}{Z_{LLG}} I_f^{(1)} - (B_{kl}^{(1)} + C_{kl}^{(1)}m)\left(\alpha^2 - \alpha + \alpha\frac{Z_{rr}^{(2)}}{Z_{LLG}}\right) I_f^{(1)} \right| \quad (25)$$

$$|I_{klc}| = \left| \frac{(B_{kl}^{(0)} + C_{kl}^{(0)}m)Z_{rr}^{(2)}}{Z_{LLG}} I_f^{(1)} - (B_{kl}^{(1)} + C_{kl}^{(1)}m)\left(\alpha - \alpha^2 + \alpha^2\frac{Z_{rr}^{(2)}}{Z_{LLG}}\right) I_f^{(1)} \right| \quad (26)$$

where $$I_f^{(1)} = \frac{1}{Z_{rr}^{(1)} + \frac{Z_{rr}^{(2)}(Z_{rr}^{(0)} + 3R_f)}{Z_{rr}^{(2)} + Z_{rr}^{(0)} + 3R_f}} \quad (27)$$

$$Z_{LLG} = Z_{rr}^{(0)} + Z_{rr}^{(2)} + 3R_f \quad (28)$$

$$\alpha = e^{j120°} \quad (29)$$

There are two unknown variables in the two real Equations (25) and (26); namely, the per unit fault distance m and the fault resistance $R_f$. Starting with the initial values of the per unit fault distance m and the fault resistance $R_f$, the Newton-Raphson technique may be employed to iteratively reach the solutions for the per unit fault distance m and the fault resistance $R_f$.

For phase B to C faults, the following formula may be used:

$$|I_{klb}| = \left| \frac{(\alpha - \alpha^2)(B_{kl}^{(1)} + C_{kl}^{(1)}m)}{2A_0^{(1)} + 2A_1^{(1)}m + 2A_2^{(1)}m + R_f} \right| \quad (30)$$

For three-phase balanced faults, the fault location formula is as follows:

$$|I_{kla}| = \left| \frac{B_{kl}^{(1)} + C_{kl}^{(1)}m}{A_0^{(1)} + A_1^{(1)}m + A_2^{(1)}m^2 + R_f} \right| \quad (31)$$

The fault location or per unit fault distance m in Equations (30) and (31) may be similarly solved as for Equation (24) by assuming the fault resistance $R_f$ is known. The fault location or the per unit fault distance formulations for faults involving other phases may be similarly derived.

The methodology uses the RMS current measurements from the feeder head, where feeder protection IEDs may be located, as with the IED 72 in FIG. 6. The values of k and l, (i.e., the terminals of the measurement branch) are then determined as the buses of the first feeder segment outside of the substation. The fault type is assumed to be known from the feeder protection IED. However, since the faulted segment is unknown, the methodology sweeps all the line segments and treats each one as a potential faulted segment. For each line segment, the values of p and q take those of the segment terminal buses. Accordingly, the coefficients $B_{kl}^{(i)}$, $C_{kl}^{(i)}$, $A_0^{(i)}$, $A_1^{(i)}$, $A_2^{(i)}$ may be calculated for each segment based on the set of equivalent sequence impedances for the segment and the sequence bus impedance matrices, as indicated in block 30, by using Equations (15)-(17) and (22)-(23). Depending on the type of fault, a specific fault location formula may be selected to calculate the estimated per unit fault distance m, and estimated fault resistance $R_f$, if applicable. For a double-line-to-ground fault, if the produced estimated per unit fault distance m is between about zero (0) and about one (1) per unit, and the fault resistance estimate, $R_f$, is a non-negative number, the corresponding segment may be regarded as a faulted segment candidate. Accordingly, this approach yields a superset containing potential faulted segments each associated with a fault resistance value.

For any other types of fault (i.e., other than double-line-to-ground faults), assuming a certain value for the fault resistance $R_f$, if the calculated fault location estimate m is between about zero (0) and about one (1) per unit, the corresponding segment may be regarded as a faulted segment candidate. Since the fault resistance $R_f$ is never known, a plausible range (e.g., 0 to 10 ohms with a step of 0.5 ohms) may be used to vary the fault resistance $R_f$. Accordingly, this approach yields a superset containing potential faulted segments each associated with a range of fault resistance values.

Figure 7:
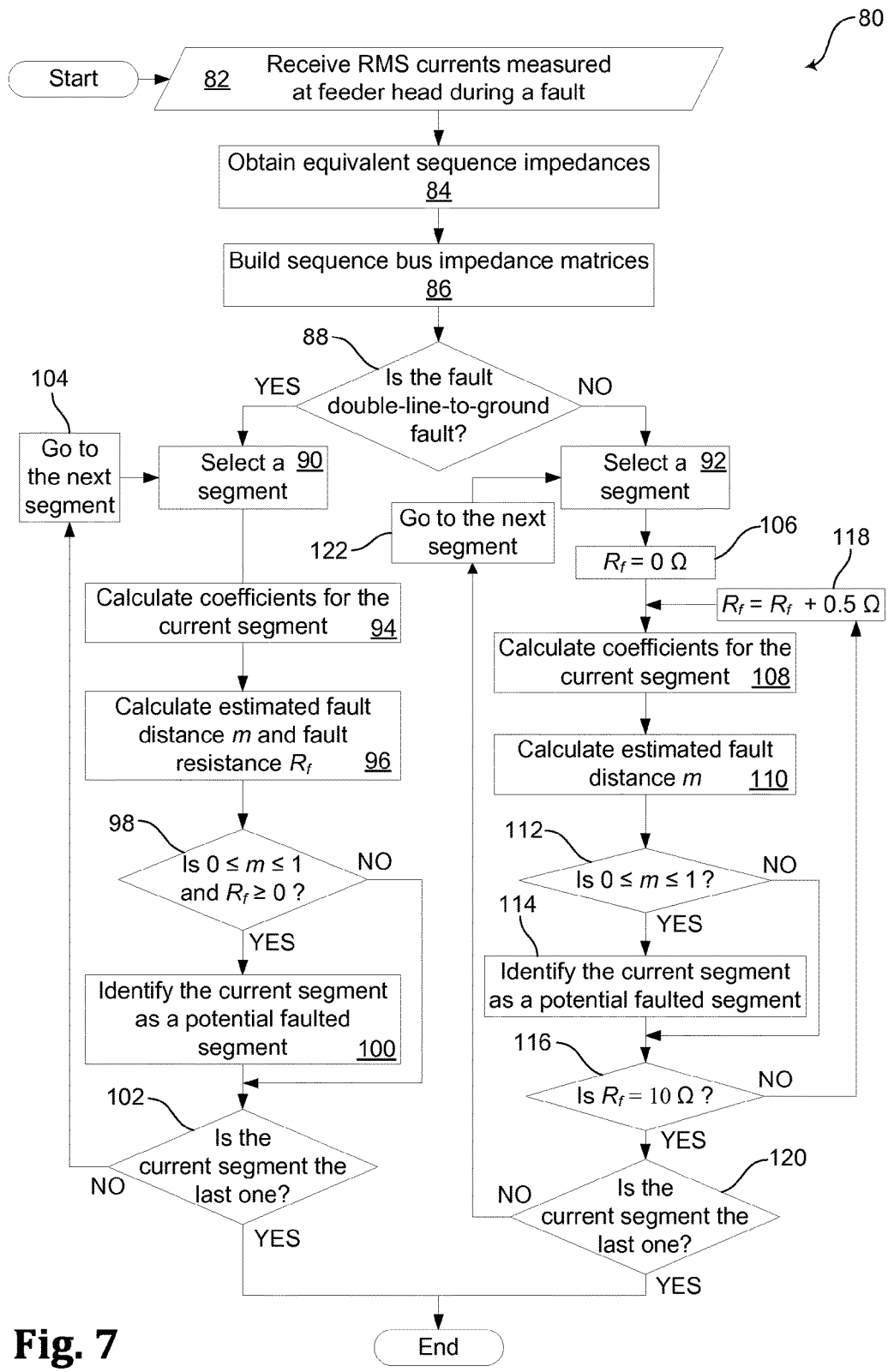
FIG. 7 is a flowchart of another nonexclusive illustrative example of a method for identifying a faulted segment in a multiphase power network, which may be suitable for use with radial networks.

Another nonexclusive illustrative example of a method for identifying a faulted segment in a multiphase power network, such as one configured as a radial network (such as the network 70 illustrated in FIG. 6), is illustrated by way of the flowchart 80 in FIG. 7. Unless otherwise specified, the method illustrated in FIG. 7 may include or be used with any of the actions and/or structures disclosed herein.

As shown in the illustrated example, the method may begin with receiving an RMS current measurement that was or is measured at or near the feeder head during a fault, as indicated at block 82. The current measurements may be read or received from any suitable source, such as from an intelligent electronic device (IED) that is suitably disposed or located within the power network, such as the IED 72 shown in FIG. 6. The method illustrated in FIG. 7 includes obtaining a set of equivalent sequence impedances for each of the plurality of segments, such as for all of the segments in the network, (block 84) and building a set of sequence bus impedance matrices for a set of sequence networks defined for the multiphase power network (block 86), such as for all of the segments in the network.

In some examples, the method illustrated in FIG. 7 may include determining whether the fault is a double-line-to-ground fault, as indicated at block 88, and then selecting a segment, as indicated at blocks 90, 92.

If the fault is a double-line-to-ground fault, coefficients are calculated for the selected segment based on the set of equivalent sequence impedances for the segment and the sequence bus impedance matrices, as generally indicated at block 94. Then, an estimated per unit fault distance m is calculated for the selected segment, along with calculating an estimated fault resistance $R_f$ based at least partially on the at least one current measurement and the coefficients for the segment, as generally indicated at block 96. Then, if the estimated per unit fault distance m is within a range from about zero (0) through about one (1), and the estimated fault resistance $R_f$ is greater than or equal to zero, the segment is identified as a potentially faulted segment, as indicated at blocks 98 and 100. If the currently selected segment is not the last one of the plurality of segments (block 102), the method illustrated in FIG. 7 proceeds to the next segment (block 104).

If the fault is not a double-line-to-ground fault, a fault resistance $R_f$ may be estimated within a predetermined range, as indicated at block 106, coefficients are calculated for the selected segment based on the set of equivalent sequence impedances for the segment and the sequence bus impedance matrices, as generally indicated at block 108, and an estimated per unit fault distance m is calculated, as indicated at block 110. Then, if the estimated per unit fault distance m is within a range from about zero (0) through about one (1), the segment is identified as a potentially faulted segment, as indicated at blocks 112 and 114. Next, the fault resistance $R_f$ is incremented, provided it remains within the predetermined range, as indicated at blocks 116 and 118. If the currently selected segment is not the last one of the plurality of segments (block 120), the method illustrated in FIG. 7 proceeds to the next segment (block 122).

The scenario where measurements are only available from the feeder head was discussed above. As may be understood, the previously described scenario may be typical for a radial network. However, for a meshed network with at least two generation resources feeding the network, current measurements from two generation resources are usually available. A nonexclusive illustrative example of a meshed network 130, with two generation resources, or sources, 132, 134 and associated IEDs 136, 138 is shown in FIG. 8.

Figure 8:
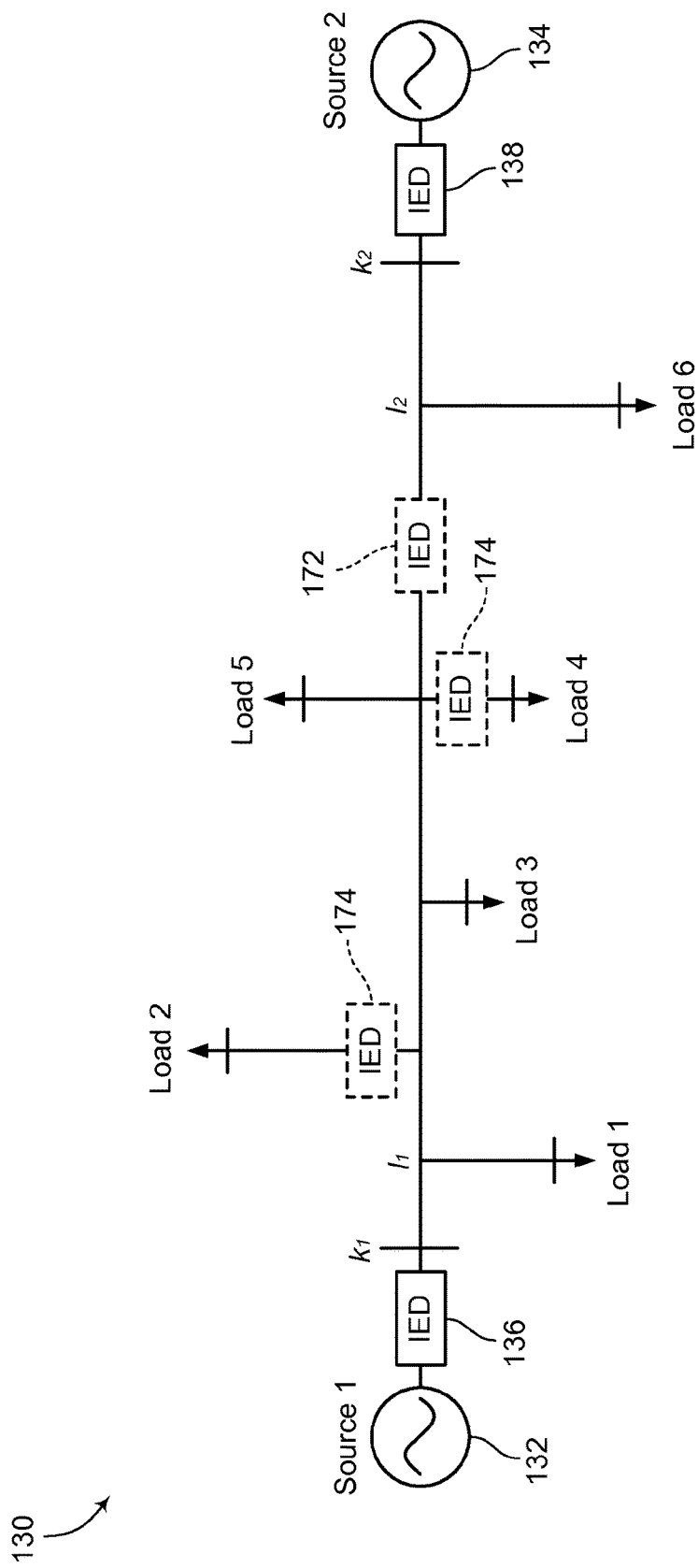
FIG. 8 is a nonexclusive illustrative example of a meshed network with two generation resources and associated IEDs.

For the illustrated example, the two branches with measurements may be assumed to be between buses $k_1$ and $l_1$, and buses $k_2$ and $l_2$, respectively, as shown in FIG. 8. The three phase RMS current magnitude measurements during the fault from branches $k_1 l_1$, and $k_2 l_2$, $|I_{k_1 l_1 a}|$, $|I_{k_1 l_1 b}|$, $|I_{k_1 l_1 c}|$, $|I_{k_2 l_2 a}|$, $|I_{k_2 l_2 b}|$, $|I_{k_2 l_2 c}|$, are available. FIG. 8 illustrates a scenario where two measurements are available for a meshed network based on the IEDs 136 and 138 at the two sources 132 and 134.

Due to the addition of the second measurement, the fault location formulations for different types of faults change accordingly. For phase A to ground faults, the following formulas may be used:

$$|I_{k_1 l_1 a}| = \left| \frac{(B^{(0)}_{k_1 l_1} + 2B^{(1)}_{k_1 l_1}) + (C^{(0)}_{k_1 l_1} + 2C^{(1)}_{k_1 l_1})m}{(A^{(0)}_0 + 2A^{(1)}_0) + (A^{(0)}_1 + 2A^{(1)}_1)m + (A^{(0)}_2 + 2A^{(1)}_2)m^2 + 3R_f} \right| \quad (32)$$

$$|I_{k_2 l_2 a}| = \left| \frac{(B^{(0)}_{k_2 l_2} + 2B^{(1)}_{k_2 l_2}) + (C^{(0)}_{k_2 l_2} + 2C^{(1)}_{k_2 l_2})m}{(A^{(0)}_0 + 2A^{(1)}_0) + (A^{(0)}_1 + 2A^{(1)}_1)m + (A^{(0)}_2 + 2A^{(1)}_2)m^2 + 3R_f} \right| \quad (33)$$

The two real Equations (32) and (33) may be used to solve for the two unknown variables; namely, the per unit fault distance m and the fault resistance $R_f$. Compared to the single-measurement scenario, there is no need to assume any value for the fault resistance.

For phase B to C to ground faults, the following formulas may be used:

$$|I_{k_1 l_1 b}| = \quad (34)$$
$$\left| \frac{(B^{(0)}_{k_1 l_1} + C^{(0)}_{k_1 l_1} m) Z^{(2)}_{rr}}{Z_{LLG}} I^{(1)}_f - (B^{(1)}_{k_1 l_1} + C^{(1)}_{k_1 l_1} m)\left(\alpha^2 - \alpha + \alpha \frac{Z^{(2)}_{rr}}{Z_{LLG}}\right) I^{(1)}_f \right|$$

$$|I_{k_1 l_1 c}| = \quad (35)$$
$$\left| \frac{(B^{(0)}_{k_1 l_1} + C^{(0)}_{k_1 l_1} m) Z^{(2)}_{rr}}{Z_{LLG}} I^{(1)}_f - (B^{(1)}_{k_1 l_1} + C^{(1)}_{k_1 l_1} m)\left(\alpha - \alpha^2 + \alpha^2 \frac{Z^{(2)}_{rr}}{Z_{LLG}}\right) I^{(1)}_f \right|$$

$$|I_{k_2 l_2 b}| = \quad (36)$$
$$\left| \frac{(B^{(0)}_{k_2 l_2} + C^{(0)}_{k_2 l_2} m) Z^{(2)}_{rr}}{Z_{LLG}} I^{(1)}_f - (B^{(1)}_{k_2 l_2} + C^{(1)}_{k_2 l_2} m)\left(\alpha^2 - \alpha + \alpha \frac{Z^{(2)}_{rr}}{Z_{LLG}}\right) I^{(1)}_f \right|$$

$$|I_{k_2 l_2 c}| = \quad (37)$$
$$\left| \frac{(B^{(0)}_{k_2 l_2} + C^{(0)}_{k_2 l_2} m) Z^{(2)}_{rr}}{Z_{LLG}} I^{(1)}_f - (B^{(1)}_{k_2 l_2} + C^{(1)}_{k_2 l_2} m)\left(\alpha - \alpha^2 + \alpha^2 \frac{Z^{(2)}_{rr}}{Z_{LLG}}\right) I^{(1)}_f \right|$$

where $I^{(1)}_f$ and $Z_{LLG}$ are obtained from (27)-(28). From Equations (34)-(37) both the fault location or per unit fault distance variable m and fault resistance variable $R_f$ may be obtained.

For phase B to C faults, the following formulas may be used:

$$|I_{k_1 l_1 b}| = \left| \frac{(\alpha - \alpha^2)(B^{(1)}_{k_1 l_1} + C^{(1)}_{k_1 l_1} m)}{2A^{(1)}_0 + 2A^{(1)}_1 m + 2A^{(1)}_2 m + R_f} \right| \quad (38)$$

$$|I_{k_2 l_2 b}| = \left| \frac{(\alpha - \alpha^2)(B^{(1)}_{k_2 l_2} + C^{(1)}_{k_2 l_2} m)}{2A^{(1)}_0 + 2A^{(1)}_1 m + 2A^{(1)}_2 m + R_f} \right| \quad (39)$$

For three-phase balanced faults, the following formulas may be used:

$$|I_{k_1 l_1 a}| = \left| \frac{B^{(1)}_{k_1 l_1} + C^{(1)}_{k_1 l_1} m}{A^{(1)}_0 + A^{(1)}_1 m + A^{(1)}_2 m^2 + R_f} \right| \quad (40)$$

$$|I_{k_2 l_2 a}| = \left| \frac{B^{(1)}_{k_2 l_2} + C^{(1)}_{k_2 l_2} m}{A^{(1)}_0 + A^{(1)}_1 m + A^{(1)}_2 m^2 + R_f} \right| \quad (41)$$

According to Equations (38)-(39) and (40)-(41), for both line to line faults and three-phase faults, both the per unit fault distance m and the fault resistance $R_f$ can be solved, which eliminates the need to assume a fault resistance value.

Compared with the one-measurement scenario, there are sufficient equations to solve for both fault location and fault resistance variables for all kinds of faults. Since there is no need to assume a fault resistance value for line-to-ground, line-to-line and three-phase balanced faults any more, less faulted segment candidates will be resulted. Similar to line-to-line-to-ground faults, the algorithm may yield a superset containing potential faulted segments each associated with a fault resistance value. When multiple measurements are available from multiple generation resources, the algorithm is the same as for the two-measurement scenario, and both the per unit fault distance m and the fault resistance $R_f$ can be estimated.

Figure 9:
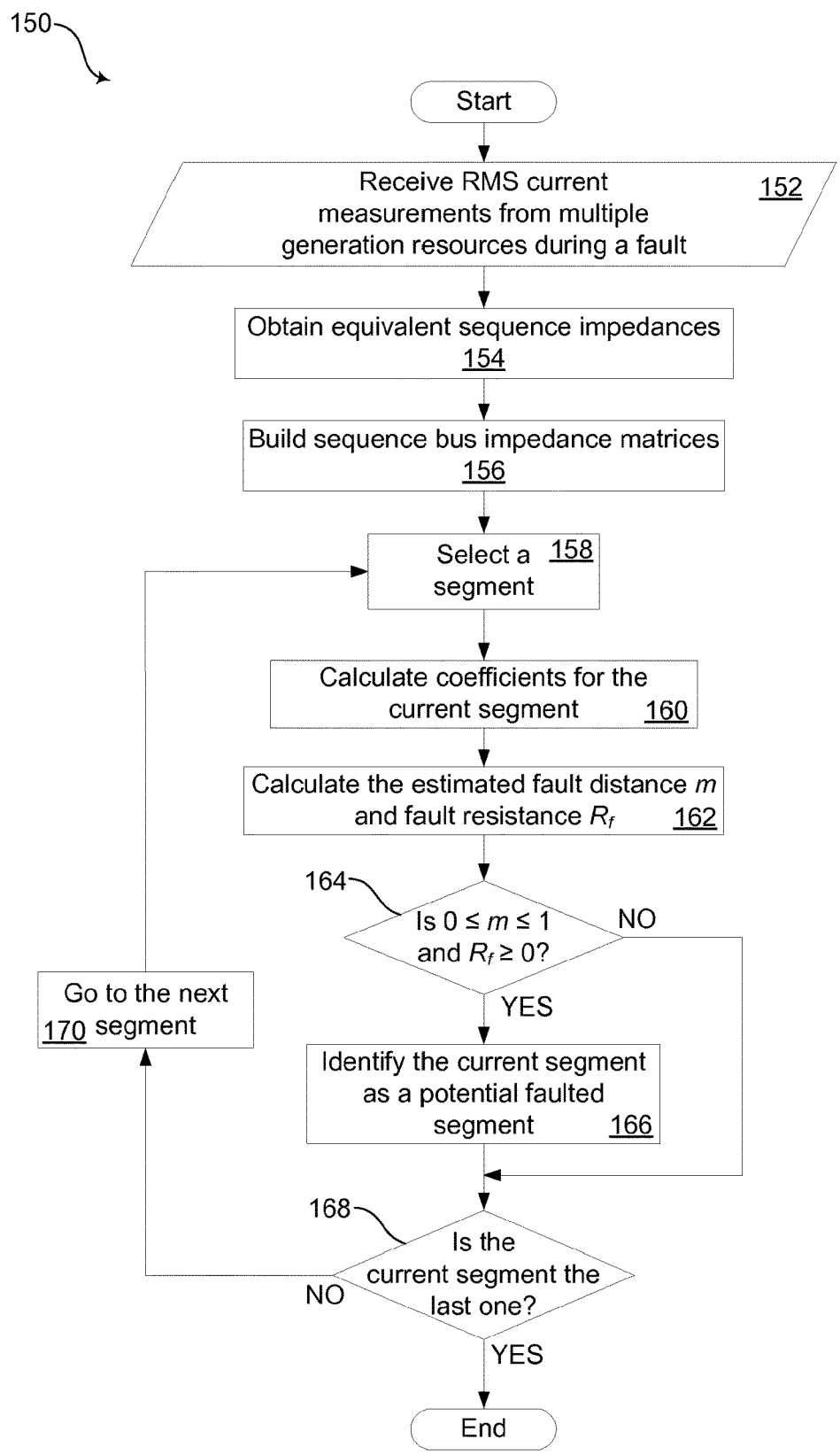
FIG. 9 is a flowchart of another nonexclusive illustrative example of a method for identifying a faulted segment in a multiphase power network, which may be suitable for use with a meshed network with multiple measurements.

Another nonexclusive illustrative example of a method for identifying a faulted segment in a multiphase power network, such as one configured as a meshed network (such as the meshed network 130 illustrated in FIG. 8, which includes a plurality of generation resources 132, 134, each having a corresponding IED 136, 138 associated therewith), is illustrated by way of the flowchart 150 in FIG. 9. Unless otherwise specified, the method illustrated in FIG. 9 may include or be used with any of the actions and/or structures disclosed herein.

As shown in the illustrated example, the method may begin with receiving RMS current measurements from multiple generation resources that were or are measured during a fault, as indicated at block 152, such as by receiving a plurality of current measurements from a plurality of IEDs associated with a plurality of generation resources. The method illustrated in FIG. 9 includes obtaining a set of equivalent sequence impedances for each of the plurality of segments, such as for all of the segments in the network, (block 154) and building a set of sequence bus impedance matrices for a set of sequence networks defined for the multiphase power network (block 156), such as for all of the segments in the network.

The method illustrated in FIG. 9 further includes selecting a segment (block 158), and calculating coefficients for the selected segment based on the set of equivalent sequence impedances for the segment and the sequence bus impedance matrices, as generally indicated by block 160. Then, an estimated per unit fault distance m is calculated for the selected segment, along with calculating an estimated fault resistance $R_f$, based at least partially on the current measurements and the coefficients for the segment, as generally indicated at block 162. If the estimated per unit fault distance m is within a range from about zero (0) through about one (1), and the estimated fault resistance $R_f$ is greater than or equal to zero, the segment is identified as a potentially faulted segment, as indicated at blocks 164 and 166. If the currently selected segment is not the last one of the plurality of segments (block 168) the method illustrated in FIG. 9 proceeds to the next segment (block 170).

Given that multiple faulted segments may be produced from the faulted segment identification method, the faulted segment reduction method may be used to uniquely identify the faulted segment for distribution networks or systems, based on during-fault current phasors at the feeder head and voltage measurements from select IEDs installed along the feeder. As is known, when a fault occurs at different locations, different voltage profiles (i.e., voltage sags along the feeder) may result. The following discloses a method to calculate the voltage sags along the feeder caused by a fault. By matching up the calculated voltage sags caused by a fault on a potential faulted segment with the measured ones from the IEDs, the true faulted segment may be identified as the one that reveals the highest similarity.

In some examples, the during-fault current phasors at the feeder head and during-fault voltage measurements from select IEDs installed along the feeder may be used to uniquely identify the faulted segment. A virtual or imaginary faulted bus or fault node may be simulated or added to a potential faulted segment to represent the fault location on the segment, such as at the mid-section point of the potential faulted segment, which augments the superimposed current injection vector by one order, the last element of which is approximated as the negative of the during-fault current measurements at the feeder head. The superimposed voltage vector throughout the network is calculated as the product of the augmented bus impedance matrix and the augmented superimposed current injection vector. In some examples, the actual faulted segment may then be identified uniquely by matching up the calculated voltages sags with the measured ones from the IEDs.

Given a fixed number of IEDs, a desirable installation locations of the IEDs may be determined as follows. Meter locations that are relatively highly or even most sensitive to the location of the fault may be selected. Another criterion for meter location selection is that these locations should have relatively low correlation coefficients, or, in some examples, as small correlation coefficients as possible. Several nonexclusive illustrative examples of IED installation locations are illustrated in the networks of FIGS. 6 and 8, which show that an IED 172 may be located on the feeder itself or one or more IEDs 174 may be located on one or more of the laterals.

In some examples, a faulted segment reduction method may include: adding a virtual or imaginary fault node at or near the mid-section point of a potential faulted segment; augmenting a sequence bus impedance matrix by one order; augmenting a superimposed current injection vector by one order, the last element of which is approximated as the negative of the during-fault sequence current measurements at a feeder head; calculating the during-fault voltage vector throughout the network as the sum of the pre-fault voltage vector and the product of the augmented bus impedance matrix and the augmented superimposed current injection vector.

The procedure to uniquely identify the faulted segment from multiple faulted segment candidates is set forth below. The bus impedance matrix $Z_0^{(i)}$ for each sequence network is already established, as set forth above. For each potentially faulted segment, a fault point may be simulated or assumed at or near the mid-point of the segment by way of a virtual or imaginary fault node, and the virtual or imaginary fault node is then treated as an additional node of the network. The sequence bus impedance matrices will then be augmented by one order denoted as $Z^{(i)}$. The elements of $Z^{(i)}$ are calculated using Equations (10)-(17), where p, q are the terminals of the potential faulted segment, and m is equal to 0.5 per unit.

The methodology approximates the sequence fault current injected into the faulted point $I_{fault}^{(i)}$, as the negative of the during-fault sequence current measured at the feeder head by ignoring the load currents. Due to the addition of the virtual or imaginary fault node, the superimposed current injection vector $I_{sup}^{(i)}$ (i=0, 1, 2) caused by the fault is augmented by one order accordingly, wherein its last element is the sequence fault current injected into the faulted node and the remaining elements are zero. $I_{sup}^{(i)}$ is formulated as follows:

$$I_{sup}^{(i)} = \begin{bmatrix} 0 \\ \vdots \\ 0 \\ \vdots \\ I_{fault}^{(i)} \end{bmatrix} \quad i = 0, 1, 2 \quad (42)$$

Then the during-fault voltage vector $V_{fault\_cal}^{(i)}$ is obtained as follows:

$$V_{fault\_cal}^{(i)} = V_{pre}^{(i)} + Z^{(i)} \times I_{sup}^{(i)} \quad i=0,1,2 \quad (43)$$

where $V_{pre}^{(i)}$ is the pre-fault voltage vector. For the positive-sequence network, the value for all of its elements is 1; for negative- or zero-sequence networks, the value for all of its elements is 0.

Next, convert the sequence voltage vectors from Equation (43) into phase voltage vectors by applying the inverse of the symmetrical component transformation. The voltage sags at each meter location for each candidate faulted segment may be calculated. The voltage mismatch at node v, with voltage measurement calculated from a virtual or imaginary fault node on potential faulted segment w, for each faulted phase, is defined as follow:

$$\delta_k^{v,w} = abs(V_{k,med}^v - V_{f,fault\_cal}^{v,w}) \quad (44)$$

where k is the faulted phase, a, b or c; $V_{k,med}^v$ is the magnitude of voltage sag, measured at node v for phase k; $V_{k,fault\_cal}^{v,w}$ is the magnitude of voltage sag at node v calculated from a virtual or imaginary fault node on potential faulted segment w for phase k; and abs(·) yields the absolute value of its argument.

Equation (44) implies three voltage mismatches for three-phase faults, two voltage mismatches for line-to-line and line-to-line-to-ground faults, and one voltage mismatch for line-to-ground faults. Only the mismatches for the faulted phase(s) are calculated. Now, define the fault location index $\eta_w$ as follows:

$$\eta_w = \frac{1}{\max(\delta_k^{v,w})} \quad v = 1, \ldots mp; w = 1, \ldots mn \quad (45)$$

where mp is the total number of nodes with voltage sag measurements and mn is the total number of candidate faulted segments.

The potential faulted segment bearing the biggest fault location index may then be identified as being the actual faulted segment. As may be understood, the faulted segment reduction method may only require feeder short-circuit analysis model, and may be applicable to both radial and meshed networks.

Figure 10:
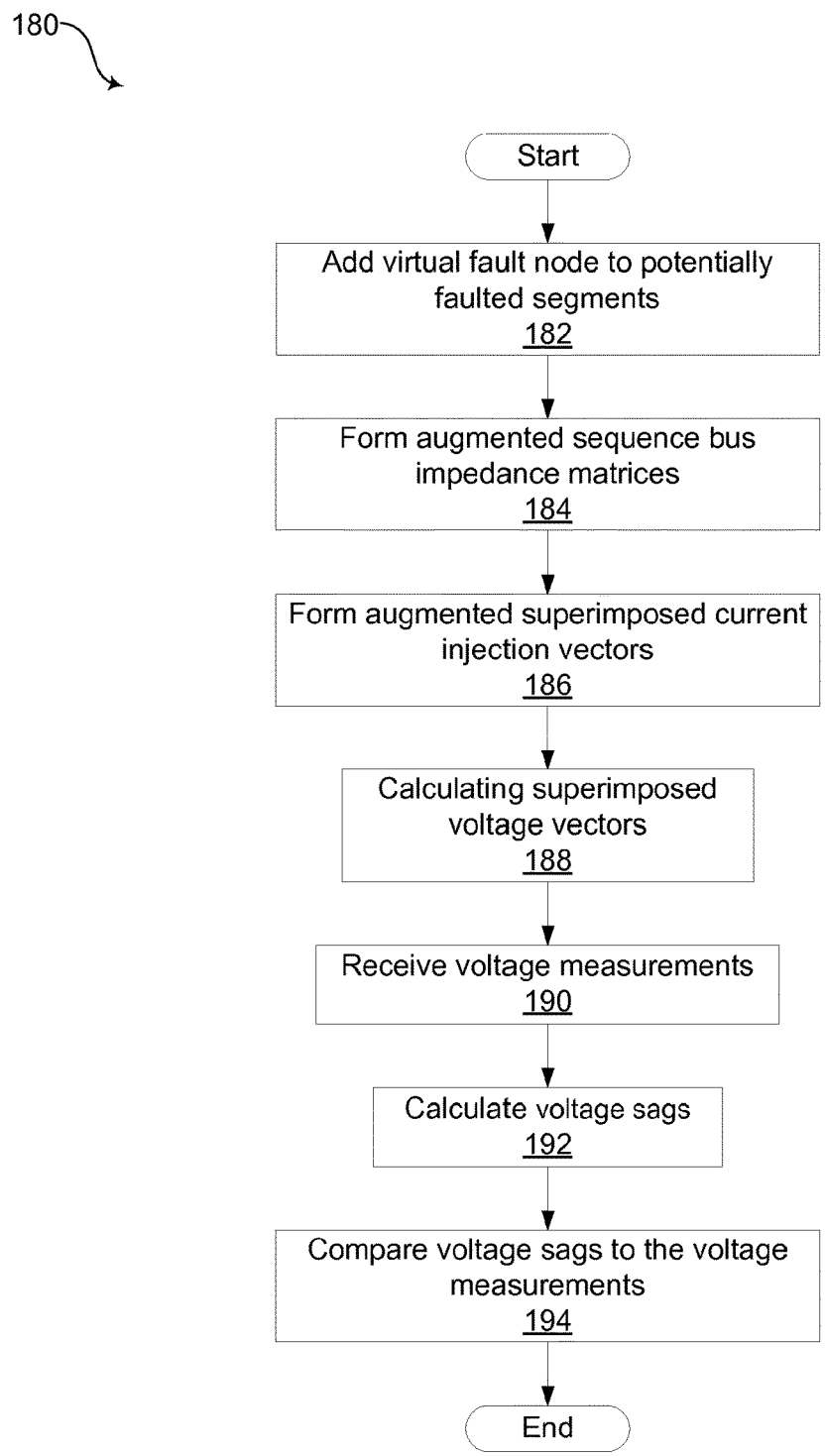
FIG. 10 is a flowchart of a nonexclusive illustrative example of a faulted segment reduction method, which may be used with methods for identifying a faulted segment in a multiphase power network.

A nonexclusive illustrative example of a faulted segment reduction method, which may be used with methods for identifying faulted segments in a multiphase power network in which at least two of the plurality of segments are identified as potentially faulted segments, is illustrated by way of the flowchart 180 in FIG. 10. Unless otherwise specified, the method illustrated in FIG. 10 may include or be used with any of the actions and/or structures disclosed herein.

The method illustrated in FIG. 10 may include identifying one of at least two segments that have been identified as potentially faulted segments as being a faulted segment. The method may include adding a virtual fault node to each of the at least two potentially faulted segments, as indicated in block 182. In some examples, the virtual fault node may be added at or near the mid-point of the segment.

The set of sequence bus impedance matrices may be augmented to form a set of augmented sequence bus impedance matrices based on the virtual fault nodes of each of the at least two potentially faulted segments, as generally indicated at block 184. An augmented superimposed current injection vector may be formed for each of the at least two potentially faulted segments, as indicated at block 186. In some examples, each augmented superimposed current injection vector may include a fault current injected into the virtual fault node for the corresponding one of the at least two potentially faulted segments.

A superimposed voltage vector may be calculated for each of the at least two potentially faulted segments, as generally indicated at block 188. In some examples, the superimposed voltage vector may be based on a product of at least one of the augmented sequence bus impedance matrices and the augmented superimposed current injection vector for the corresponding one of the at least two potentially faulted segments.

The method illustrated in FIG. 10 may include receiving a plurality of voltage measurements, as generally indicated at block 190. The voltage measurements may be, or have been, measured during the fault by a plurality of measurement locations disposed within the power network. A set of voltage sags may be calculated for the plurality of measurement locations based on the superimposed voltage vector for each of the at least two potentially faulted segments, as generally indicated at block 192. The set of calculated voltage sags for each of the at least two potentially faulted segments may be compared to the plurality of voltage measurements, as generally indicated at block 194.

Figure 11:
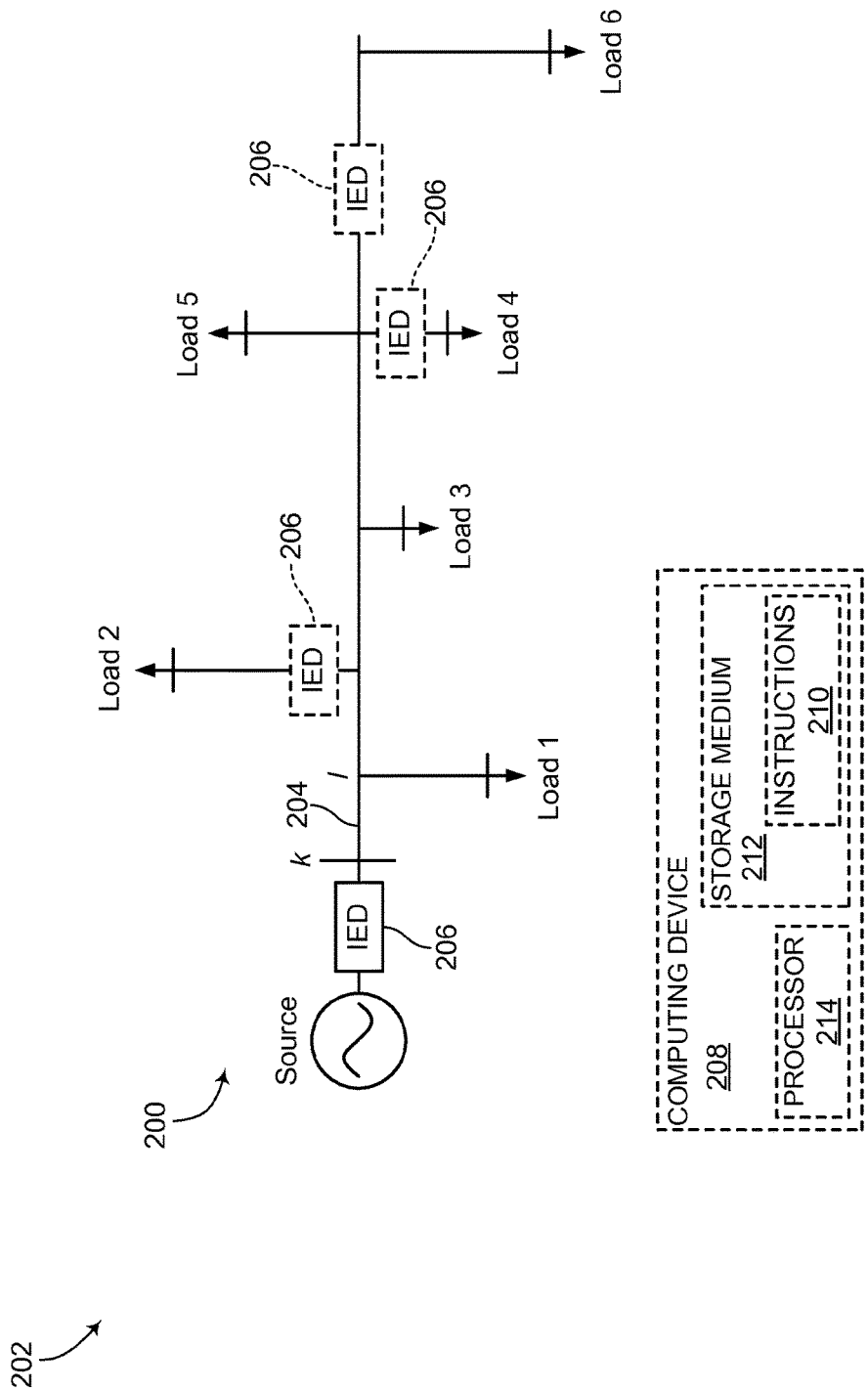
FIG. 11 is a schematic diagram of a nonexclusive illustrative example of a system for identifying a faulted segment in a multiphase power network that includes a plurality of segments.

A nonexclusive illustrative example of a system for identifying a faulted segment in a multiphase power network 200 that includes a plurality of segments is shown generally at 202 in FIG. 11. Unless otherwise specified, the system 202 may, but is not required to, contain at least one of the structures, components, functionalities, and/or variations described, illustrated, and/or incorporated herein. As shown in FIG. 11, the network 200 includes a plurality of segments, such as the segment 204 between k and l. In the illustrated example, the system 202 includes at least one IED 206 disposed within the power network 200 and a computing device 208. The computing device 208 comprises a plurality of machine-readable instructions 210 embodied on a computer readable storage medium 212 and a processor 214 configured to execute the instructions.

The process to restore service following a confirmed fault may generally include Fault Location, Isolation, and Service Restoration (FLISR). In some examples, the FLISR process includes the utility crew patrolling the faulted lateral and going through a few re-fusing attempts to locate the faulted segment between two switches, such as the elbows of the service transformers; the crew opening up the two terminal switches of the faulted segment; and the crew closing the normally open switch such that the power is restored to the healthy segments of the lateral. Although the repair crew still needs to locate the fault on the faulted segment, that work takes place later outside the restoration window of seconds/minutes.

Although not explicit, the restoration process does require that the faulted segment be known. This is a relaxed requirement over fault location (i.e., distance to fault), with the faulted segment between two switches being identified for isolation purposes. The disclosed systems and methods may uniquely identify the faulted segment between two switches for distribution circuits, which may expedite the fault location and service restoration. The disclosed systems and methods can be integrated with a Distribution Management System (DMS) or may be deployed on a substation computer. Therefore, the disclosed systems and methods may provide a flexible solution amenable to both control center and substation environment, including supporting a distributed architecture.

In North America (NA) and other parts of the world that practice NA standards, the existence of single-phase and double-phase laterals may causes unbalance in the distribution networks or systems, which may render the fault location methods based on traditional three-phase to sequence component treatment of lines as impractical for single-phase and double-phase laterals. The disclosed systems and methods may overcome this obstacle and provide a faulted segment identification method applicable to unbalanced multiphase distribution networks or systems. As may be understood, the disclosed systems and methods may adopt the equivalent three phase line models for the multiphase line segment using dummy lines, and thus include all three-phase primary line segments as well as single/double-phase laterals described with the corresponding sequence domain impedance values, and then apply the bus impedance matrix technique based fault location method to the equivalent three-phase distribution feeder so as to yield a list of potential faulted segments that includes single-phase and double-phase laterals, which is where many faults occur.

The disclosed systems and methods may use sequence component modeling and bus impedance matrix techniques to identify faulted segment(s) on multiphase distribution circuits, and may uniquely identify the faulted segment by comparing the calculated voltage sags with those measured from select IEDs deployed along the feeder.

The disclosed systems and methods provide a faulted segment identification method that may be suited to both three-phase main lines and single-phase and double-phase laterals, such as by taking the heterogeneity of the line segments into account. The disclosed systems and methods may be applicable to radial networks as well as meshed networks and amenable to extension to other feeder topologies, such as those involving multiple generation resources or distributed energy resources (DERs). The disclosed systems and methods use the line impedance parameters in the sequence domain, which may be readily available and used in network or system studies such as short circuit analysis.

The disclosed systems and methods may extend the fault location method based on symmetrical components to unbalanced distribution feeders by making use of the equivalent three-phase line models for the multiphase line segments. In some examples, the disclosed systems and methods may operate or be performed using only the line impedances in the sequence domain (zero and positive sequence values), which may be available from standard tables based on knowing the conductor size and material, which may eliminate the need for phase domain line parameters, which may not be directly available.

In some examples, the disclosed systems and methods may uniquely identify the faulted segment as opposed to providing multiple fault location candidates. The disclosed systems and methods may use during-fault current phasors at the feeder head and during-fault voltage measurements from multiple IEDs installed along the feeder, and may calculate the voltage sags along the feeder based on the established sequence bus impedance matrix from the faulted segment identification method. The disclosed systems and methods may add a virtual or imaginary fault node to a potentially faulted segment, such as at the mid-section of the potentially faulted segment, and augment the superimposed current injection vector by one order, with the last element of the superimposed current injection vector being approximated as the negative of the during-fault current measurements at the feeder head, and then calculate the superimposed voltage vector throughout the network as the product of the augmented bus impedance matrix and the augmented superimposed current injection vector. By matching up the calculated voltages sags caused by a fault on a potential faulted segment with the measured ones from the IEDs, the true faulted segment may be identified as the one that reveals the highest similarity between calculated and measured voltage sags.

The faulted segment identification method supports identifying faulted segments for unbalanced distribution networks and systems including single-phase and double-phase laterals, rather than merely identifying the faulted segments on three-phase main lines. In some examples, the faulted segment identification method is capable of functioning based on the line impedances in the sequence domain (zero and positive sequence values), which may be available from standard tables based on the conductor size and material. In some examples, the faulted segment identification method may be capable of functioning without shunt capacitances of line segments, load information or direct phase parameters, which may not be directly available, which may simplify modeling data requirements.

In some examples, the faulted segment identification method operates based on only the RMS current magnitude measurements, without needing voltage and/or current phasors as input. The faulted segment identification method may be used with both radial and meshed networks, including those with multiple generation resources or distributed energy resources. In some examples, the RMS current measurements may be obtained from any of the generation resources feeding the network.

The faulted segment reduction method may function based on during-fault current phasors at the feeder head and voltage measurements from select IEDs along the feeder that have the ability to measure voltages, and in some examples, doing so without requiring either synchronized pre-fault and during-fault voltage and current phasors at the substation or the voltage sag magnitudes recorded at selected IEDs along the feeder.

The faulted segment reduction method may permit calculating voltage sags along the feeder for each potential faulted segment based on the established sequence bus impedance matrix from the faulted segment identification method. The faulted segment reduction method may function based on the short-circuit model of the network, including doing so without shunt capacitances of the lines and load data.

The disclosed methods and systems may be embodied as or take the form of the methods and systems previously described, as well as of a transitory or non-transitory computer readable medium having a plurality of machine- or computer-readable instructions stored thereon that, when executed by a computer processor, cause the at least one computer processor to carry out operations of the disclosed systems and/or perform the disclosed methods as computer-implemented or computer-executed methods. The computer-readable medium may be any medium that can contain, store, communicate, propagate, or transport the instructions for use by or in connection with the instruction executing processor, system, apparatus, or device and may, by way of example but without limitation, be an electronic, magnetic, optical, electromagnetic, infrared, or semiconductor system, apparatus, device, or propagation medium or other suitable medium upon which the program is recorded. More specific examples (a non-exhaustive list) of such a computer-readable medium may include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the disclosed methods and systems may be written in any suitable programming language provided it allows achieving the previously described technical results.

The instructions may be configured for execution on any system or computing device having sufficient processing power and access to the required data, which may support or allow real-time operation and/or automated notification or operation. For example, the processor that executes the instructions may be communicatively linked to an IED and located in any suitable location, such as in a computer, server or gateway located at the substation or in a control room. In some examples, the method may be performed at least partially within the IED. For example, some IEDs may have sufficient processing power such that the methods may be fully embedded into an IED platform.

Depending on the particular implementation of the disclosed methods and systems, the various modules thereof may correspond to one or more hardware components, or the various modules may be implemented as software modules or components, which may be executed at a single site or by way of distributed computing, with various portions of the modules being performed at various locations. As will be understood, such software modules may be executed wherever sufficient processing power and appropriate data exist or are accessible. For example, the software modules may be executed or performed by a processor located in a control room or substation and linked to the IED or, in some examples, by a processor within the IED. As used herein, a software module or component may include any type of computer instruction or computer executable code located within a memory device and/or transmitted as electronic signals over a system bus or wired or wireless network. A software module may, for instance, comprise one or more physical or logical blocks of computer instructions, which may be organized as a routine, program, object, component, data structure, etc., that performs one or more tasks or implements particular abstract data types.

As used herein the term "configured" should be interpreted to mean that the identified elements, components, or other subject matter are selected, created, implemented, utilized, designed, modified, adjusted and/or intended to perform the indicated action and/or to perform, operate, behave and/or react in the indicated manner.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the disclosure includes all novel and non-obvious combinations and subcombinations of the various elements, features, functions and/or properties disclosed herein. Similarly, recitation in the disclosure and/or the claims of "a," "a first" or "the" element, or the equivalent thereof, should be understood to include incorporation of one or more such elements, neither requiring nor excluding two or more such elements, unless the context clearly indicates otherwise. As used herein, the terms "having", "containing", "including", "comprising" and the like are open ended terms that indicate the presence of stated elements or features, but do not preclude additional elements or features.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. A method for identifying a faulted segment in a multiphase power network that includes a plurality of segments comprising at least one three phase segment and at least one multiphase segment, the at least one multiphase segment comprising at least one single phase segment and/or at least one double phase segment, the method comprising:
   receiving at least one current measurement measured during a fault by an intelligent electronic device (IED) disposed within the power network;
   obtaining a set of equivalent sequence impedances for each of the plurality of segments, wherein the equivalent sequence impedance obtained for the at least one multiphase segment is based on an equivalent three-phase model that includes one or more existing lines of the at least one multiphase segment and one or more dummy lines;
   building a set of sequence bus impedance matrices for a set of sequence networks defined for the multiphase power network, wherein the step of building a set of sequence bus impedance matrices includes determining at least an equivalent sequence impedance value for the at least one multiphase segment using the one or more existing lines and the one or more dummy lines;
   selecting a segment from the plurality of segments;
   calculating coefficients for the segment based on the set of equivalent sequence impedances for the segment and the sequence bus impedance matrices;
   calculating an estimated per unit fault distance for the segment based at least partially on the at least one current measurement and the coefficients for the segment;
   identifying the segment as a potentially faulted segment if the estimated per unit fault distance for the segment is within a range from about zero through about one; and
   repeating for each of the plurality of segments the elements of selecting a segment, calculating coefficients, calculating an estimated per unit fault distance, and identifying as a potentially faulted segment if the estimated per unit fault distance for the segment is within a range from about zero through about one.

2. The method of claim 1, wherein the set of equivalent sequence impedances for each of the plurality of segments comprises an equivalent zero-sequence impedance, an equivalent positive-sequence impedance and an equivalent negative-sequence impedance, and the set of sequence bus impedance matrices comprises a zero-sequence bus impedance matrix for the multiphase power network, a positive-sequence bus impedance matrix for the multiphase power network, and a negative-sequence bus impedance matrix for the multiphase power network.

3. The method of claim 1, wherein the multiphase power network is configured as a radial network comprising a feeder and the at least one current measurement is measured proximate a feeder head of the feeder.

4. The method of claim 3, comprising:
determining whether the fault is a double-line-to-ground fault; and
wherein:
if the fault is a double-line-to-ground fault, the method comprises calculating an estimated fault resistance for the selected segment based at least partially on the at least one current measurement and the coefficients for the segment, and identifying the segment as a potentially faulted segment further comprises identifying the segment as a potentially faulted segment if the estimated fault resistance is greater than or equal to zero; and
if the fault is not a double-line-to-ground fault, the method comprises estimating a fault resistance within a predetermined range.

5. The method of claim 1, wherein:
the multiphase power network includes a plurality of generation resources;
each of the plurality of generation resources includes a corresponding IED associated therewith; and
receiving at least one current measurement measured during a fault by an IED disposed within the power network comprises receiving a plurality of current measurements from a plurality of the IEDs associated with the plurality of generation resources.

6. The method of claim 1, wherein at least two of the plurality of segments are identified as potentially faulted segments, and the method comprises identifying one of the at least two potentially faulted segments as a faulted segment.

7. The method of claim 6, wherein identifying one of the at least two potentially faulted segments as a faulted segment comprises:
adding a virtual fault node to each of the at least two potentially faulted segments;
augmenting the set of sequence bus impedance matrices to form a set of augmented sequence bus impedance matrices based on the virtual fault nodes of each of the at least two potentially faulted segments;
forming an augmented superimposed current injection vector for each of the at least two potentially faulted segments, wherein each augmented superimposed current injection vector includes a fault current injected into the virtual fault node for a corresponding one of the at least two potentially faulted segments;
calculating a superimposed voltage vector for each of the at least two potentially faulted segments based on a product of at least one of the augmented sequence bus impedance matrices and the augmented superimposed current injection vector for the corresponding one of the at least two potentially faulted segments;
receiving a plurality of voltage measurements measured during the fault by a plurality of measurement locations disposed within the power network;
calculating a set of voltage sags for the plurality of measurement locations based on the superimposed voltage vector for each of the at least two potentially faulted segments; and comparing the set of voltage sags calculated for each of the at least two potentially faulted segments to the plurality of voltage measurements.

8. The method of claim 7, wherein the fault current injected into the virtual fault node is approximated as the negative of a fault current measured at a feeder head.

9. A non-transitory computer readable storage medium having embodied thereon a plurality of machine-readable instructions that when executed by at least one computer processor cause the at least one computer processor to perform a method for identifying a faulted segment in a multiphase power network that includes a plurality of segments comprising at least one three phase segment and at least one multiphase segment, the at least one multiphase segment comprising at least one single phase segment and/or at least one double phase segment, the plurality of machine-readable instructions comprising instructions to:
receive at least one current measurement measured during a fault by an intelligent electronic device (IED) disposed within the power network;
obtain a set of equivalent sequence impedances for each of the plurality of segments, wherein the equivalent sequence impedance obtained for the at least one multiphase segment is based on an equivalent three-phase model that includes one or more existing lines of the at least one multiphase segment and one or more dummy lines;
build a set of sequence bus impedance matrices for a set of sequence networks defined for the multiphase power network, wherein the set of sequence bus impedance matrices uses at least an equivalent sequence impedance value for the at least one multiphase segment using the one or more existing lines and the one or more dummy lines;
select a segment from the plurality of segments;
calculate coefficients for the segment based on the set of equivalent sequence impedances for the segment and the sequence bus impedance matrices;
calculate an estimated per unit fault distance for the segment based at least partially on the at least one current measurement and the coefficients for the segment;
identify the segment as a potentially faulted segment if the estimated per unit fault distance for the segment is within a range from about zero through about one; and
repeat for each of the plurality of segments the instructions to select a segment, calculate coefficients, calculate an estimated per unit fault distance, and identify as a potentially faulted segment if the estimated per unit fault distance for the segment is within a range from about zero through about one.

10. The non-transitory computer readable storage medium of claim 9, wherein the set of equivalent sequence impedances for each of the plurality of segments comprises an equivalent zero-sequence impedance, an equivalent positive-sequence impedance and an equivalent negative-sequence impedance, and the set of sequence bus impedance matrices comprises a zero-sequence bus impedance matrix for the multiphase power network, a positive-sequence bus impedance matrix for the multiphase power network, and a negative-sequence bus impedance matrix for the multiphase power network.

11. The non-transitory computer readable storage medium of claim 9, wherein the multiphase power network is configured as a radial network comprising a feeder and the at least one current measurement is measured proximate a feeder head of the feeder.

12. The non-transitory computer readable storage medium of claim 11, comprising instructions to:
determine whether the fault is a double-line-to-ground fault; and
wherein:
if the fault is a double-line-to-ground fault, the machine-readable instructions comprises instructions to calculate an estimated fault resistance for the selected segment based at least partially on the at least one current measurement and the coefficients for the segment, and the instructions to identify the segment as a potentially faulted segment further comprise instructions to identify the segment as a potentially faulted segment if the estimated fault resistance is greater than or equal to zero; and
if the fault is not a double-line-to-ground fault, the machine-readable instructions comprises instructions to estimate a fault resistance within a predetermined range.

13. The non-transitory computer readable storage medium of claim 9, wherein:
the multiphase power network includes a plurality of generation resources;
each of the plurality of generation resources includes a corresponding IED associated therewith; and
the instructions to receive at least one current measurement measured during a fault by an IED disposed within the power network comprise instructions to receive a plurality of current measurements from a plurality of the IEDs associated with the plurality of generation resources.

14. The non-transitory computer readable storage medium of claim 9, wherein at least two of the plurality of segments are identified as potentially faulted segments, and the machine-readable instructions comprises instructions to identify one of the at least two potentially faulted segments as a faulted segment.

15. The non-transitory computer readable storage medium of claim 14, wherein the instructions to identify one of the at least two potentially faulted segments as a faulted segment comprise instructions to:
add a virtual fault node to each of the at least two potentially faulted segments;
augment the set of sequence bus impedance matrices to form a set of augmented sequence bus impedance matrices based on the virtual fault nodes of each of the at least two potentially faulted segments;
form an augmented superimposed current injection vector for each of the at least two potentially faulted segments, wherein each augmented superimposed current injection vector includes a fault current injected into the virtual fault node for a corresponding one of the at least two potentially faulted segments;
calculate a superimposed voltage vector for each of the at least two potentially faulted segments based on a product of at least one of the augmented sequence bus impedance matrices and the augmented superimposed current injection vector for the corresponding one of the at least two potentially faulted segments;
receive a plurality of voltage measurements measured during the fault by a plurality of measurement locations disposed within the power network;
calculate a set of voltage sags for the plurality of measurement locations based on the superimposed voltage vector for each of the at least two potentially faulted segments; and
compare the set of voltage sags calculated for each of the at least two potentially faulted segments to the plurality of voltage measurements.

16. A system for identifying a faulted segment in a multiphase power network that includes a plurality of segments comprising at least one three phase segment and at least one multiphase segment, the at least one multiphase segment comprising at least one single phase segment and/or at least one double phase segment, the system comprising:
at least one intelligent electronic device (IED) disposed within the power network; and
a computing device comprising a plurality of machine-readable instructions embodied on a computer readable storage medium and a processor configured to execute the instructions, the plurality of machine-readable instructions comprising instructions to:
receive at least one current measurement measured during a fault by an intelligent electronic device (IED) disposed within the power network;
obtain a set of equivalent sequence impedances for each of the plurality of segments, wherein the equivalent sequence impedance obtained for the at least one multiphase segment is based on an equivalent three-phase model that includes one or more existing lines of the at least one multiphase segment and one or more dummy lines;
build a set of sequence bus impedance matrices for a set of sequence networks defined for the multiphase power network, wherein the set of sequence bus impedance matrices uses at least an equivalent sequence impedance value for the at least one multiphase segment using one or more existing lines and the one or more dummy lines;
select a segment from the plurality of segments;
calculate coefficients for the segment based on the set of equivalent sequence impedances for the segment and the sequence bus impedance matrices;
calculate an estimated per unit fault distance for the segment based at least partially on the at least one current measurement and the coefficients for the segment;
identify the segment as a potentially faulted segment if the estimated per unit fault distance for the segment is within a range from about zero through about one; and
repeat for each of the plurality of segments the instructions to select a segment, calculate coefficients, calculate an estimated per unit fault distance, and identify as a potentially faulted segment if the estimated per unit fault distance for the segment is within a range from about zero through about one.

17. The system of claim 16, wherein the set of equivalent sequence impedances for each of the plurality of segments comprises an equivalent zero-sequence impedance, an equivalent positive-sequence impedance and an equivalent negative-sequence impedance, and the set of sequence bus impedance matrices comprises a zero-sequence bus impedance matrix for the multiphase power network, a positive-sequence bus impedance matrix for the multiphase power network, and a negative-sequence bus impedance matrix for the multiphase power network.

18. The system of claim 16, wherein the multiphase power network is configured as a radial network comprising a feeder and the at least one current measurement is measured proximate a feeder head of the feeder.

19. The system of claim 18, comprising instructions to:
determine whether the fault is a double-line-to-ground fault; and wherein:
if the fault is a double-line-to-ground fault, the machine-readable instructions comprises instructions to calculate an estimated fault resistance for the selected segment based at least partially on the at least one current measurement and the coefficients for the segment, and the instructions to identify the segment as a potentially faulted segment further comprise instructions to identify the segment as a potentially faulted segment if the estimated fault resistance is greater than or equal to zero; and
if the fault is not a double-line-to-ground fault, the machine-readable instructions comprises instructions to estimate a fault resistance within a predetermined range.

20. The system of claim 16, wherein:
the multiphase power network includes a plurality of generation resources;
each of the plurality of generation resources includes a corresponding IED associated therewith; and
the instructions to receive at least one current measurement measured during a fault by an IED disposed within the power network comprise instructions to receive a plurality of current measurements from a plurality of the IEDs associated with the plurality of generation resources.

21. The system of claim 16, wherein at least two of the plurality of segments are identified as potentially faulted segments, and the machine-readable instructions comprises instructions to identify one of the at least two potentially faulted segments as a faulted segment.

22. The system of claim 21, wherein the instructions to identify one of the at least two potentially faulted segments as a faulted segment comprise instructions to:
add a virtual fault node to each of the at least two potentially faulted segments;
augment the set of sequence bus impedance matrices to form a set of augmented sequence bus impedance matrices based on the virtual fault nodes of each of the at least two potentially faulted segments;
form an augmented superimposed current injection vector for each of the at least two potentially faulted segments, wherein each augmented superimposed current injection vector includes a fault current injected into the virtual fault node for a corresponding one of the at least two potentially faulted segments;
calculate a superimposed voltage vector for each of the at least two potentially faulted segments based on a product of at least one of the augmented sequence bus impedance matrices and the augmented superimposed current injection vector for the corresponding one of the at least two potentially faulted segments;
receive a plurality of voltage measurements measured during the fault by a plurality of measurement locations disposed within the power network;
calculate a set of voltage sags for the plurality of measurement locations based on the superimposed voltage vector for each of the at least two potentially faulted segments; and
compare the set of voltage sags calculated for each of the at least two potentially faulted segments to the plurality of voltage measurements.

* * * * *